United States Patent
Nagai et al.

[11] Patent Number: 6,128,238
[45] Date of Patent: Oct. 3, 2000

[54] DIRECT SENSING SEMICONDUCTOR MEMORY DEVICE

[75] Inventors: Kenji Nagai; Satoru Kawamoto; Takaaki Furuyama, all of Kasugai, Japan

[73] Assignee: Fujitsu Limited, Kawasaki, Japan

[21] Appl. No.: 09/492,005

[22] Filed: Jan. 27, 2000

[30] Foreign Application Priority Data

Jan. 27, 1999 [JP] Japan .................................. 11-018247

[51] Int. Cl.⁷ ...................................................... G11C 7/00
[52] U.S. Cl. ......................................... 365/207; 365/208
[58] Field of Search ................................... 365/207, 205, 365/208, 189.01

[56] References Cited

U.S. PATENT DOCUMENTS

| | | | |
|---|---|---|---|
| 5,594,681 | 1/1997 | Taguchi | 365/207 |
| 5,796,666 | 8/1998 | Shirley et al. | 365/207 |
| 5,903,502 | 5/1999 | Porter | 365/207 |
| 6,064,612 | 5/2000 | Agata | 365/207 |

FOREIGN PATENT DOCUMENTS 6-032190   10/1994   Japan .

OTHER PUBLICATIONS

"Non–Precharged Bit–Line Scheme for High–Speed Low–Power DRAMS", Kato et al, *1998 Symposium on VLSI Circuits Digest of Technical Papers*, pp. 16–17.

*Primary Examiner*—Son T. Dinh
*Attorney, Agent, or Firm*—Arent Fox Kintner Plotkin & Kahn, PLLC

[57] ABSTRACT

A direct sensing type semiconductor memory device combines read and write data bus lines in order to conserve real estate. The memory device includes a bit line pair and a sense amplifier connected between the lines of the bit line pair, and a data line pair. A first transistor is connected between a first potential and one of the data lines of the data line pair, and a gate of the first transistor is connected to one of the bit lines of the bit line pair. A second transistor is connected between the first potential and the other one of the data lines, and its gate is connected to the other of the bit lines. A switch circuit is connected between the data line pair and the bit line pair and transfers data from the data line pair to the bit line pair in accordance with a potential difference between the data line pair and the bit line pair.

16 Claims, 10 Drawing Sheets

DIRECT SENSING SEMICONDUCTOR MEMORY DEVICE

BACKGROUND OF THE INVENTION

The present invention relates to a semiconductor memory device, and more particularly, to a semiconductor memory device employing a direct sensing technique.

A 16 bit I/O dynamic random access memory (DRAM) and a system LSI having a 32 bit I/O DRAM have been developed. In the near future, a 32 bit I/O DRAM and a system LSI having a 64 bit I/O DRAM will most likey be developed.

A DRAM has a plurality of memory cells. Each cell has a transistor and a capacitor and retains data consisting of "1" and "0". A word line connected to the transistor is activated to transfer a slight charge accumulated in the capacitor to a bit line. A sense amplifier differentially amplifies the slight differential potential at the bit line and transfers the amplified differential potential to a data bus line. Data is read from the memory cell in this manner.

A direct sensing technique is employed to transfer the bit line potential to the data bus line. The direct sensing technique is important for preventing abnormalities that may be caused when increasing the speed of the semiconductor memory device.

FIG. 1 is a schematic circuit diagram showing a prior art DRAM 40 employing the direct sensing technique. The DRAM 40 is provided with a memory array including a matrix of memory cells C. Each of the memory cells C has a capacitor and a MOS transistor and is connected to one of the intersections between the word lines WLi-WLn and the bit line pairs (BLZi, BLXi)-(BLZn, BLXn).

Sense amplifiers 41 are respectively connected to each of the bit line pairs (BLZi, BLXi)-(BLZn, BLXn) to amplify the slight differential potential between the associated pair of bit lines. Each sense amplifier 41 has a CMOS inverter connected between a high potential power supply PSG and a low potential power supply NSG.

A write data bus line WDBiz is connected to the bit lines BLZi-BLZn, and a write data bus line WDBix is connected to the bit lines BLXi-BLXn. Write transistors TN20 are respectively connected between the write data bus line WDBiz and each bit line BLZi-BLZn and between the write data bus line WDBix and each bit line BLXi-BLXn. The gate of each transistor TN20 receives an associated column selection signal WYSELi-WYSELn provided by a column decoder (not shown).

Sets of series-connected read transistors TN21, TN22 are connected between a read data bus line RDBiZ and the ground and between a read data bus line RDBiX and the ground. The gates of each transistor TN22 are connected to the associated bit line pairs (BLZi, BLXi)-(BLZn, BLXn). The gate of each transistor TN21 receives an associated column selection signal RYSELi-RYSELn provided by the column decoder.

The operation of the DRAM 40 will now be described with reference to the timing chart of FIG. 2.

In a cell data read mode, when a word line WL is selected by a word decoder group (not shown) in accordance with a row address, the memory cell transistor connected to the word line WL in each of the memory cells C is activated. This transfers a slight charge to the bit line pairs BLZi-BLZn, BLXi-BLXn. In this state, the power supply PSG and the power supply NSG, each precharged to ½ of the Vdd level, are shifted to the high potential power supply Vdd level and the low potential power supply Vss level, respectively, to activate the associated sense amplifier 41. This amplifies the slight potential at the bit line pairs (BLZi, BLXi)-(BLZn, BLXn) to the high potential power supply Vdd level and the low potential power supply Vss level.

After the amplified differential potential at the bit line pairs (BLZi, BLXi)-(BLZn, BLXn) reaches a certain a value, one of the column selection signals, for example, RYSELi is selected by a column decoder group (not shown) in accordance with a column address. This activates the associated read transistors TN21 and transfers the amplified differential potential of the bit line pair BLZi, BLXi to the read data bus line pair RDBiZ, RDBiX. The data is then read from an output circuit (not shown).

In a cell data write mode, if one of the column selection signals, for example, WYSELi goes high after a control signal WE goes high, the associated write transistors TN20 are activated. This transfers data from the write data bus line pair WDBiZ, WDBiX to the bit line pair BLZi, BLXi via the write transistors TN20 and writes the data to the associated memory cells C.

In the DRAM 40, which employs the direct sensing technique, the sense amplifiers 41 are spaced from the data bus line pair WDBiZ, WDBiX, which have a large load. Thus, the load on the sense amplifiers is small. This permits high speed operation during the read mode. However, the read data bus line pair RDBiZ, RDBiX and the write data bus line pair WDBiZ, WDBiX are provided separately. Further, the write and read column selection lines are provided separately. This increases the size of the data bus section and, consequently, the chip area.

Enlargement of the DRAM and an increase in the number of I/Os increases the number of I/O-related read data bus line pairs RDBiZ, RDBiX and write data bus line pairs WDBiZ, WDBiX. Therefore, employment of the direct sensing technique results in large increase in the chip area.

FIG. 3 shows a DRAM 50 described in Japanese Unexamined Patent Publication No. 6-302190 that has a decreased area. The DRAM 50 uses a data bus line pair DBiZ, DBiX, which functions as both the write data bus line pair WDBiZ, WDBiX and the read data bus line pair RDBiZ, RDBiX.

However, the DRAM 50 still uses separate lines for the read column selection signals RYSELi-RYSELn and the write column selections signals WYSELi-WYSELn. This hinders further reduction in the data bus area.

As shown in FIGS. 4 and 5, the read column selection signals RYSELi-RYSELn and the column selection signals WYSELi-WYSELn are generated by a column decoder 51 in accordance with a write control signal WE from a write control circuit 52 and address signals Ai-An from an address buffer 53.

The DRAM 50 includes a plurality of memory cell arrays 54 (FIG. 5), each being provided with the column decoder 51. Accordingly, a line for transferring the control signal WE from the write control circuit 52 must be laid out along each column decoder 51. This increases the total line capacitance, which includes the parasitic capacitance Q1 of the lines and the gate capacitance Qg of the logic gates. As a result, power is consumed inefficiently and high speed read and write operations are interfered with.

SUMMARY OF THE INVENTION

It is an object of the present invention to provide a semiconductor memory device that operates at high speeds and has a reduced circuit area.

To achieve the above object, the present invention provides a semiconductor memory device including a bit line pair having a first bit line and a second bit line. A sense amplifier is connected between the first and second bit lines. A data line pair has a first data line and a second data line. A first transistor is connected to a predetermined potential and the first data line of the data line pair. The gate of the first transistor is connected to the first bit line of the bit line pair. A second transistor is connected to the predetermined potential and the second data line of the data line pair. The gate of the second transistor is connected to the second bit line of the bit line pair. A potential difference switch circuit is connected between the data line pair and the bit line pair to transfer data from the data line pair to the bit line pair in accordance with a potential difference between the data line pair and the bit line pair.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
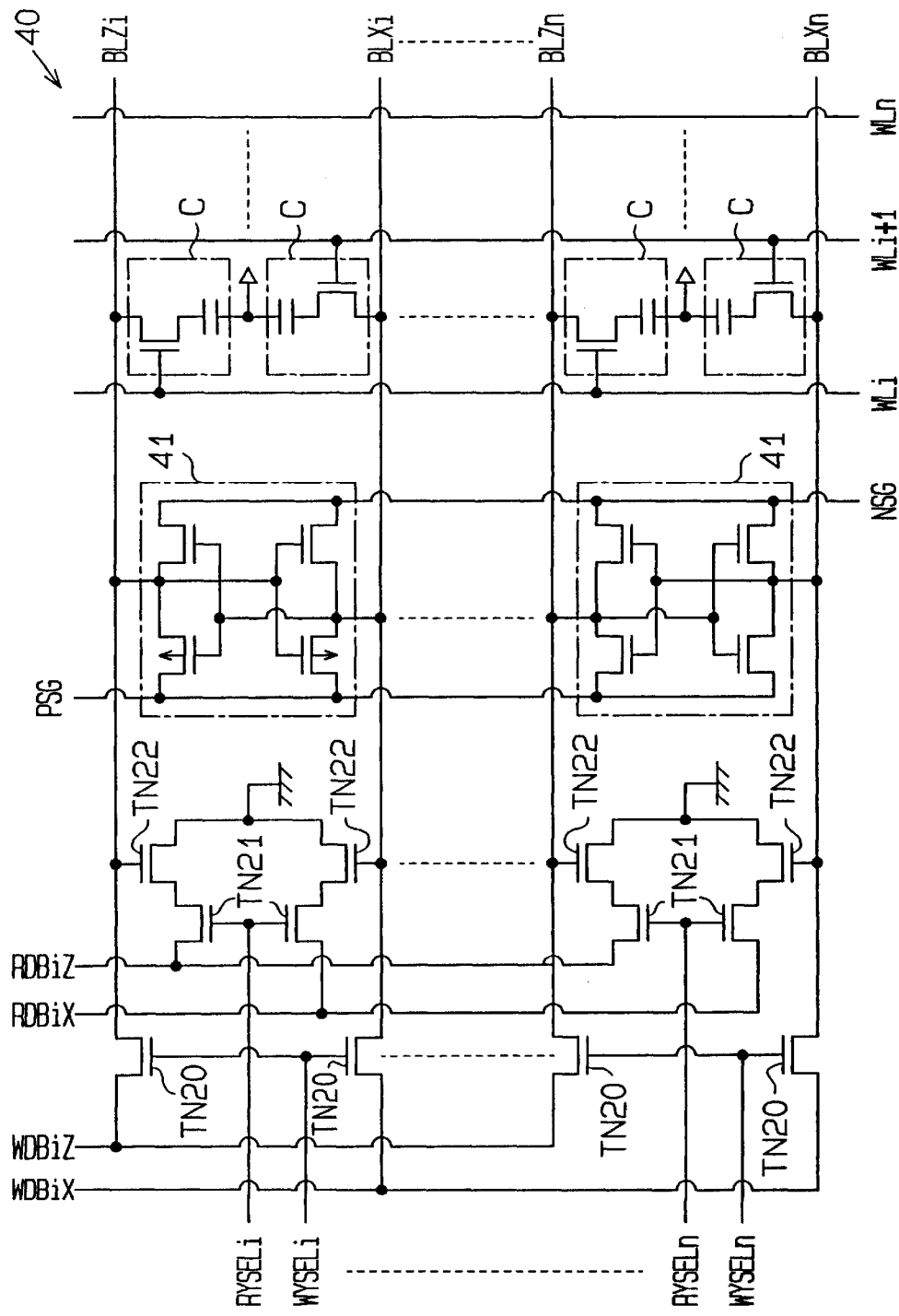
FIG. 1 is a schematic circuit diagram showing a first example of a prior art DRAM.
Figure 2:
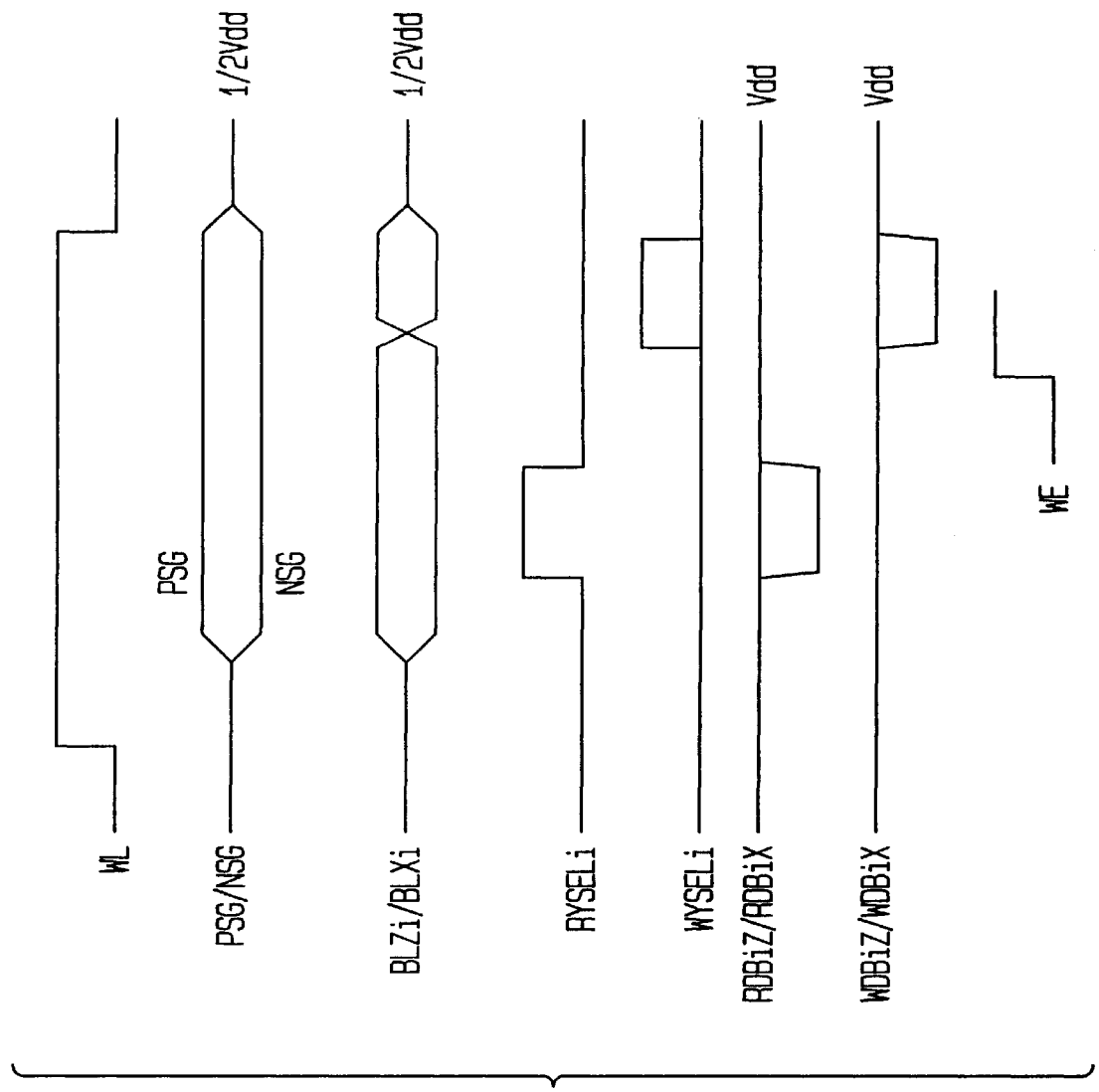
FIG. 2 is a timing chart showing the operation of the DRAM of FIG. 1.
Figure 3:
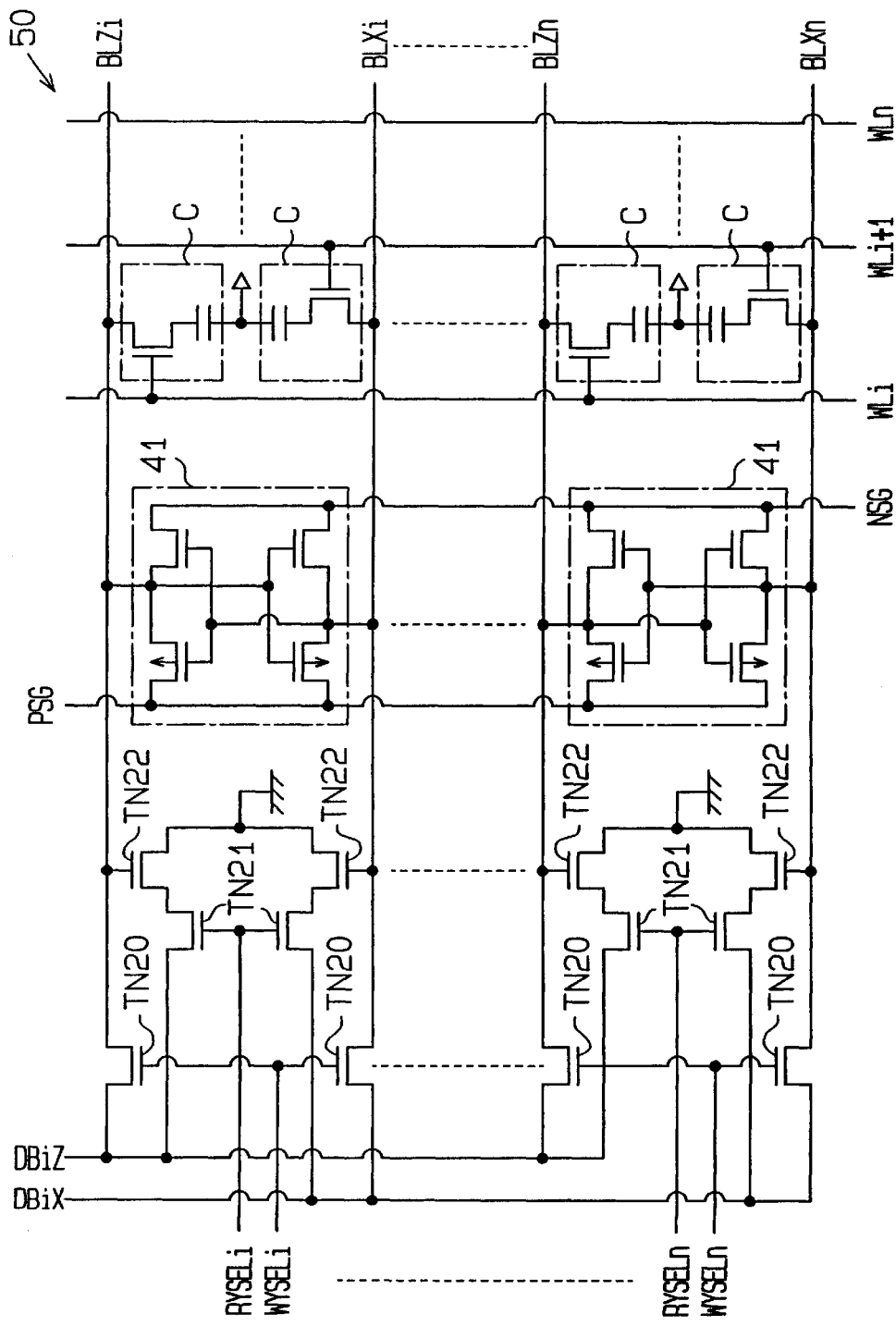
FIG. 3 is a schematic circuit diagram showing a second example of a prior art DRAM.

In the drawings, like numerals are used for like elements throughout.

Figure 6:
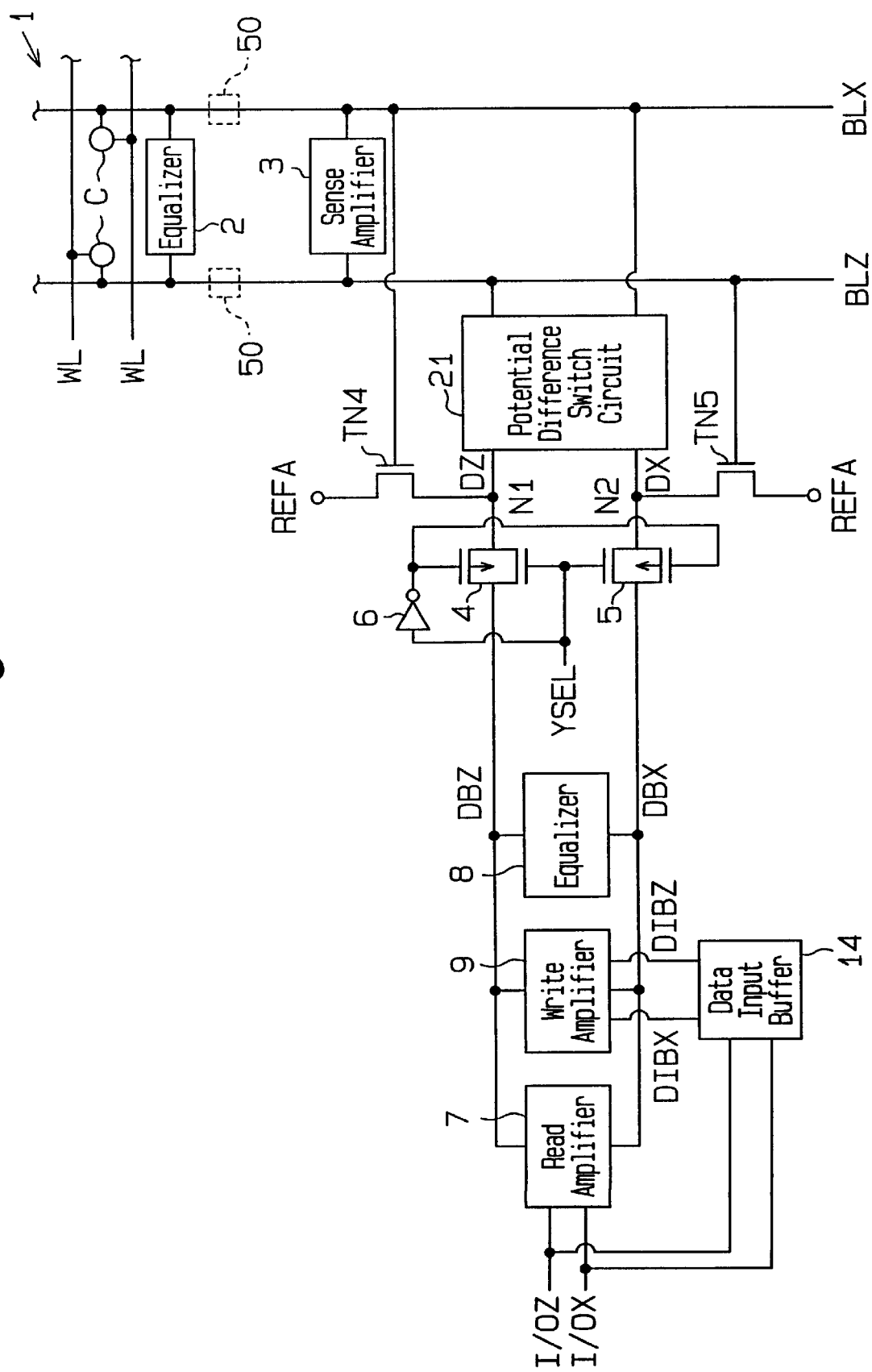
FIG. 6 is a schematic block diagram showing a DRAM according to a first embodiment of the present invention.

FIG. 6 is a circuit diagram showing a DRAM 1 according to a first embodiment of the present invention. The DRAM 1, which employs the direct sensing technique, includes an equalizer 2 and a sense amplifier 3 that are connected between a bit line pair BLZ, BLX.

Figure 7:
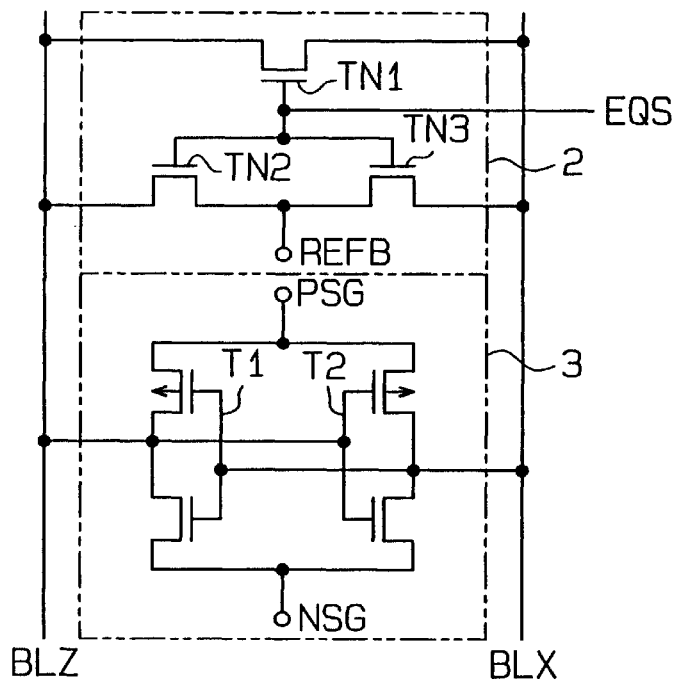
FIG. 7 is a schematic circuit diagram showing a first equalizer and a sense amplifier of the DRAM of FIG. 6.

As shown in FIG. 7, the equalizer 2 has an NMOS transistor TN1, connected between the bit lines BLZ, BLX, and NMOS transistors TN2, TN3, connected in series between the bit lines BLZ, BLX. A reference potential REFB is applied to a node between the transistor TN2 and the transistor TN3. The gates of the transistors TN1, TN2, TN3 are connected to each other and receive a control signal EQS. Each of the transistors TN1–TN3 is activated when the control signal EQS is high. If the control signal EQS goes high when the DRAM 1 is in a standby mode, the equalizer 2 resets the potential at the bit line pair BLZ, BLX to the reference potential REFB. The reference potential REFB is set at ½ of the Vdd level.

The sense amplifier 3 includes CMOS inverters T1, T2. The output terminal of the CMOS inverter T1 is connected to the input terminal of the CMOS inverter T2 and the bit line BLZ. The output terminal of the CMOS inverter T2 is connected to the input terminal of the CMOS inverter T1 and the bit line BLX.

The CMOS inverters T1, T2 are connected between a high potential power supply PSG, which supplies a high potential to the bit line pair BLZ, BLX, and a low potential power supply NSG, which supplies a low potential to the bit line pair BLZ, BLX. The sense amplifier 3 is deactivated when the power supplies PSG, NSG have an intermediate potential level (½ of the Vdd level) and activated when the power supplies PSG, NSG respectively have a high potential power supply level Vdd and a low potential power supply level Vss.

With reference to FIG. 6, the bit line pair BLZ, BLX and word lines WL are connected to memory cells C. The selection of a word line WL transfers a slight charge from the associated memory cell C to the bit line pairs BLZ, BLX. The sense amplifier 3 receives a high potential and a low potential from the power supplies PSG, NSG, respectively, and amplifies the slight differential potential at the bit line pair BLZ, BLX to the high potential power supply Vdd level and the low potential power supply Vss level. Switches (bit line isolation gates) 50 (shown in broken lines) may be connected between the part of the bit line pair BLZ, BLX connected to the memory cells and the part of the bit line pair BLX, BLX connected to the sense amplifier 3. The bit line isolation gates partition the bit line pair into a sense amplifier side and a memory cell side so that the sense amplifier 3 is not affected by the capacitance of the memory cell side.

A first read transistor TN4 is connected between a reference potential REFA and a data line DZ. The gate of the read transistor TN4 is connected to the bit line BLX. When the read transistor TN4 is activated by the potential of the bit line BLX, the transistor TN4 sets the data line DZ at the reference potential REFA level. A second read transistor TN5 is connected between the reference potential REFA and a data line DX. The gate of the read transistor TN5 is connected to the bit line BLZ. When the read transistor TN5 is activated by the potential of the bit line BLZ, the transistor TN5 sets the data line DX at the reference potential REFA level. The read transistors TN4, TN5 transfer data from the bit line pair BLZ, BLX to the data line pair DZ, DX.

It is preferred that the reference potential REFA be set at the low potential power supply Vss level. The reference potential REFA may also be set at the low potential power supply NSG level. In this case, the reference potential REFA is ½ of the Vdd level in the standby mode and equal to the low potential power supply Vss level when the sense amplifier 3 is activated.

The data lines DZ, DX are connected to data bus lines DBZ, DBX via column switches 4, 5, each of which comprises an NMOS transistor and a PMOS transistor. A column selection signal YSEL is applied to the gate of the NMOS transistor of each column switch 4, 5. A column selection signal YSEL inverted by an inverter circuit 6 is applied to the gate of the PMOS transistor of each column switch 4, 5. When the column switches 4, 5 are activated in response to a high column selection signal YSEL, data is transferred from the data line pair DZ, DX to the data bus line pair DBZ, DBX. The column switches 4, 5 connect one of a plurality of the bit line pairs BLZ, BLX to the data bus line pair DBZ, DBX. The DRAM 1 has a plurality of the column switch pairs 4, 5 to selectively connect one of a plurality of data line pairs DZ, DX to the data bus line pair DBZ, DBX.

Figure 4:
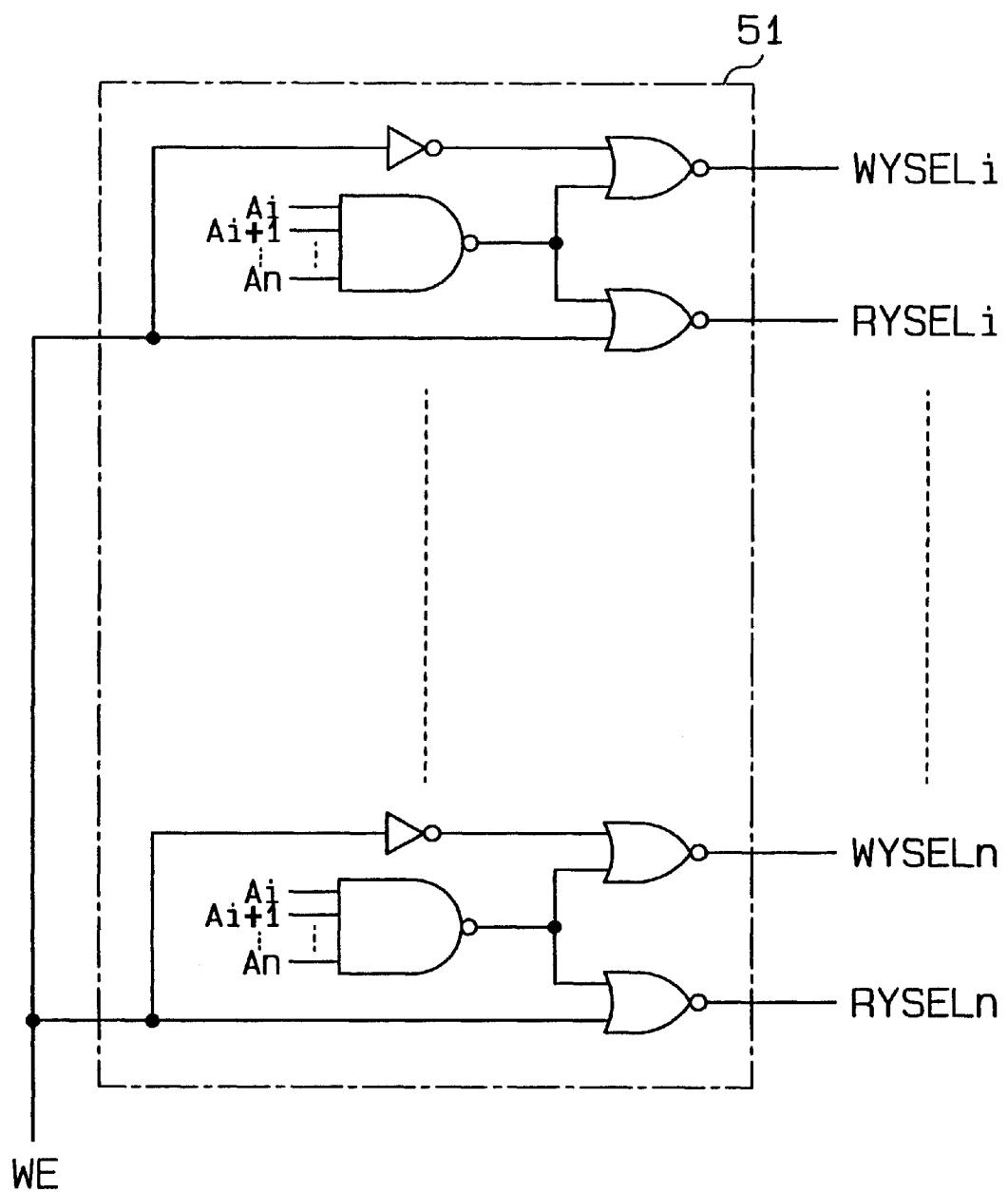
FIG. 4 is a schematic circuit diagram showing a prior art column decoder of the DRAM of FIG. 3.
Figure 5:
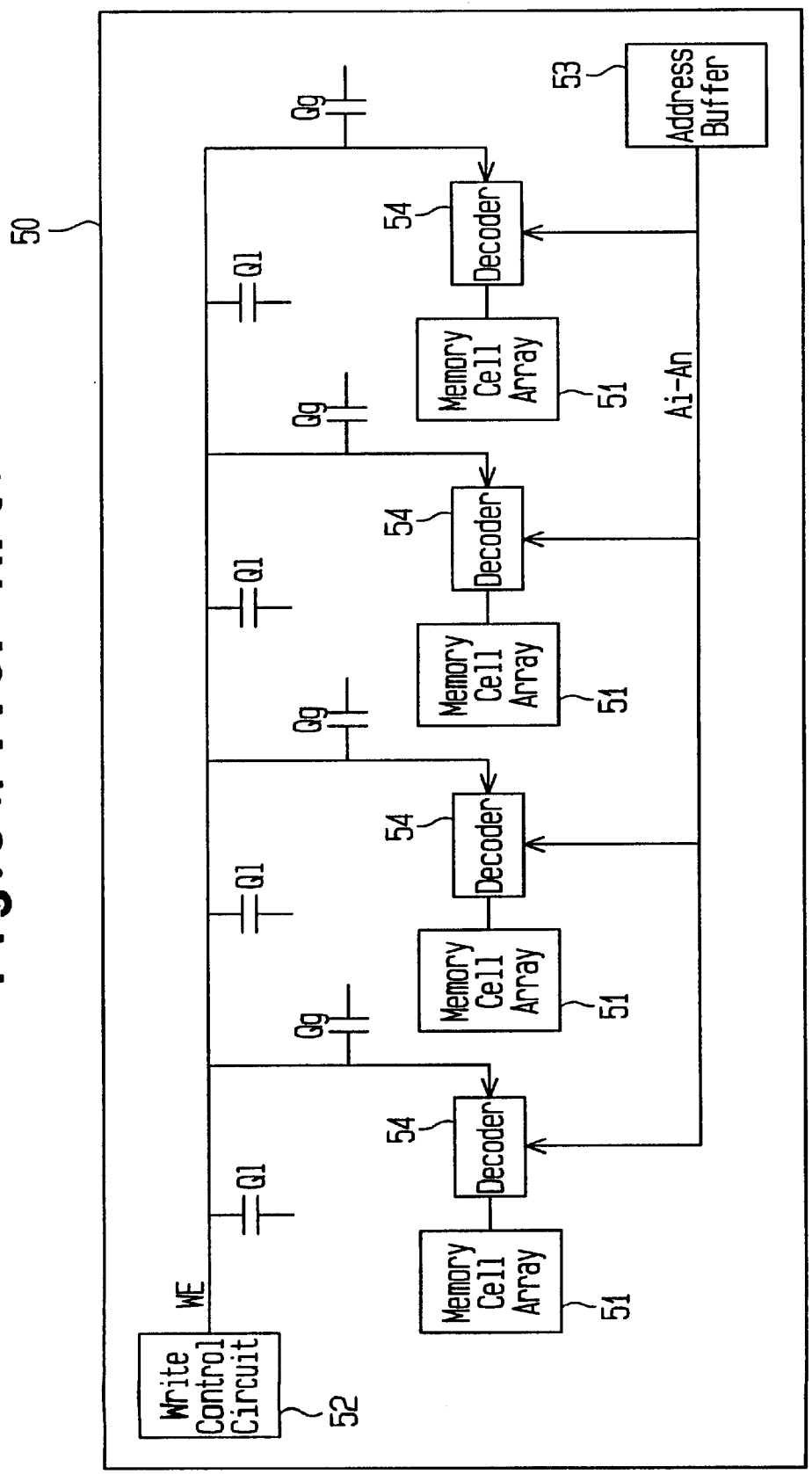
FIG. 5 is a schematic block diagram of the DRAM of FIG. 3.

The column selection signal YSEL is generated from an address signal. A column decoder (not shown) of the DRAM 1 receives the address signal and includes a plurality of NAND circuits for generating the plurality of the column selections signals YSEL. The column decoder of the DRAM 1 may be equivalent to the prior art column decoder 51 or may differ, for example, the column decoder could include the NAND gates, but not the NOR circuits and the inverter circuits (see FIG. 4). Accordingly, the control signal WE need not be provided to the column decoder as in the prior art. The column selection signal YSEL is used for both the read operation and the write operation. Thus, the number of lines for transferring the column selection signal is reduced to half of that of the prior art DRAM.

A read amplifier 7, an equalizer 8, and a write amplifier 9 are connected between the data bus line pair DBZ, DBX. The read amplifier 7 amplifies the differential potential of the data on the data bus line pair DBZ, DBX and provides the amplified differential potential to an output circuit (not shown).

Figure 8:
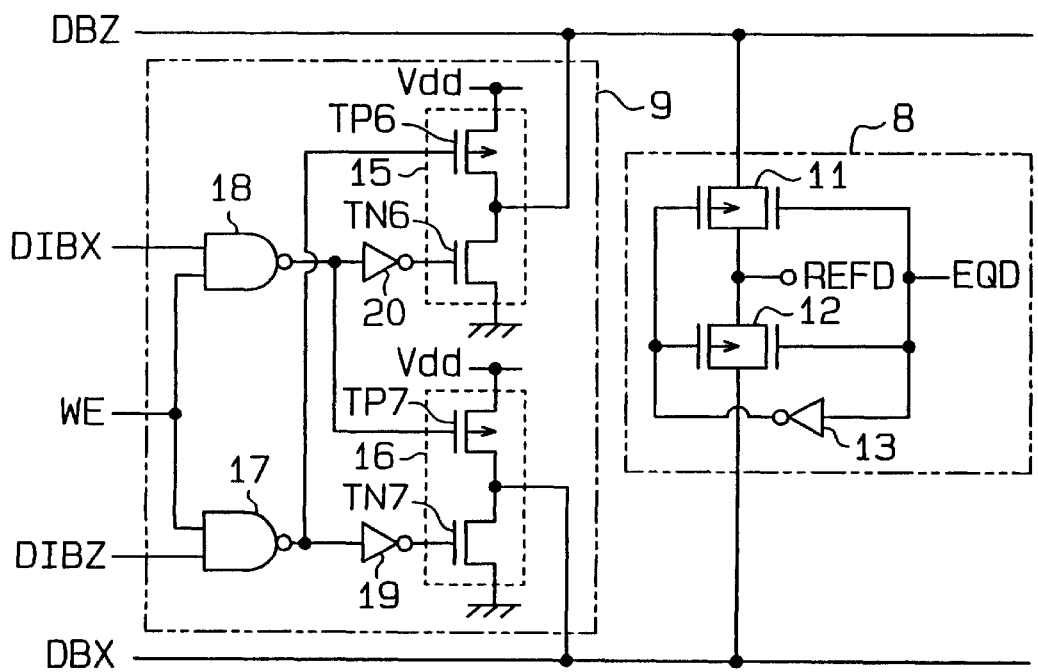
FIG. 8 is a schematic circuit diagram showing a second equalizer and a write amplifier of the DRAM of FIG. 6.

Referring to FIG. 8, the equalizer 8 has two transmission gates 11, 12 connected in series between the data bus line pair DBZ, DBX. Each transmission gate 11, 12 includes an NMOS transistor and a PMOS transistor. A reference potential REFD is applied to a node between the transmission gates 11, 12. The gate of the NMOS transistor of each transmission gate 11, 12 receives a control signal EQD. The gate of the PMOS transistor of each transmission gate 11, 12 receives the control signal EQD inverted by an inverter 13.

In the standby mode, the transmission gates 11, 12 are activated when the control signal EQD goes high to equalize the data bus line pair DBZ, DBX with the reference potential REFD. The reference potential REFD is preferably set at the high potential power supply potential REFD.

Referring again to FIG. 6, the write amplifier 9 receives signals DIBZ, DIBX, which are complements of signals I/OZ, I/OX via a data input buffer 14. As shown in FIG. 8, the write amplifier 9 includes a first drive circuit 15 and a second drive circuit 16. The first drive circuit 15 has a PMOS transistor TP6 and an NMOS transistor TN6, which are connected in series. The second drive circuit 16 has a PMOS transistor TP7 and an NMOS transistor TN7, which are connected in series. The output terminal of the first drive circuit 15 is connected to the data bus line DBZ. The output terminal of the second drive circuit 16 is connected to the data bus line DBX.

The write amplifier 9 further includes a first NAND circuit 17 and a second NAND circuit 18. The first NAND circuit 17 receives the signal DIBZ from the data input buffer 14 and the write control signal WE and provides a first NAND logic signal to the gate of the PMOS transistor TP6 of the first drive circuit 15. The first NAND logic signal is also inverted by an inverter circuit 19 and provided to the gate of the NMOS transistor TN7 of the second drive circuit 16. The second NAND circuit 18 receives the signal DIBX from the data input buffer 14 and the write control signal WE and provides a second NAND logic signal to the gate of the PMOS transistor TP7 of the second drive circuit 16. The second NAND logic signal is also inverted by an inverter circuit 20 and provided to the gate of the NMOS transistor TN6 of the first drive circuit 15.

When the control signal WE and the signal DIBZ are both high and the signal DIBX is low, the first NAND logic signal is low and the second NAND logic signal is high. Thus, the first drive circuit 15 causes the data bus line DBZ to go high, and the second drive circuit 16 causes the data bus line DBX to go low. On the other hand, if the signal DIBZ is low and the signal DIBX is high, the data bus line DBZ goes low and the data bus line DBX goes high.

When the control signal WE is low, the first and second drive circuits 15, 16 are deactivated and their outputs enter a high impedance state.

As shown in FIG. 6, a potential difference switch circuit 21 is connected between the data line pair DZ, DX and the bit line pair BLZ, BLX (sense amplifier side). That is, each of the bit line pairs BLZ, BLX has the potential difference switch 21. In accordance with the potential difference between the associated bit line pair BLZ, BLX, the potential difference switch circuit 21 connects the bit line connected with the gate of one of the read transistors to the data line driven by the other read transistor. That is, the data line DX driven by the read transistor TN5, which is connected to the bit line BLZ, is connected to the bit line BLX. The data line DZ driven by the read transistor TN4, which is connected to the bit line BLX, is connected to the bit line BLZ.

Figure 9:
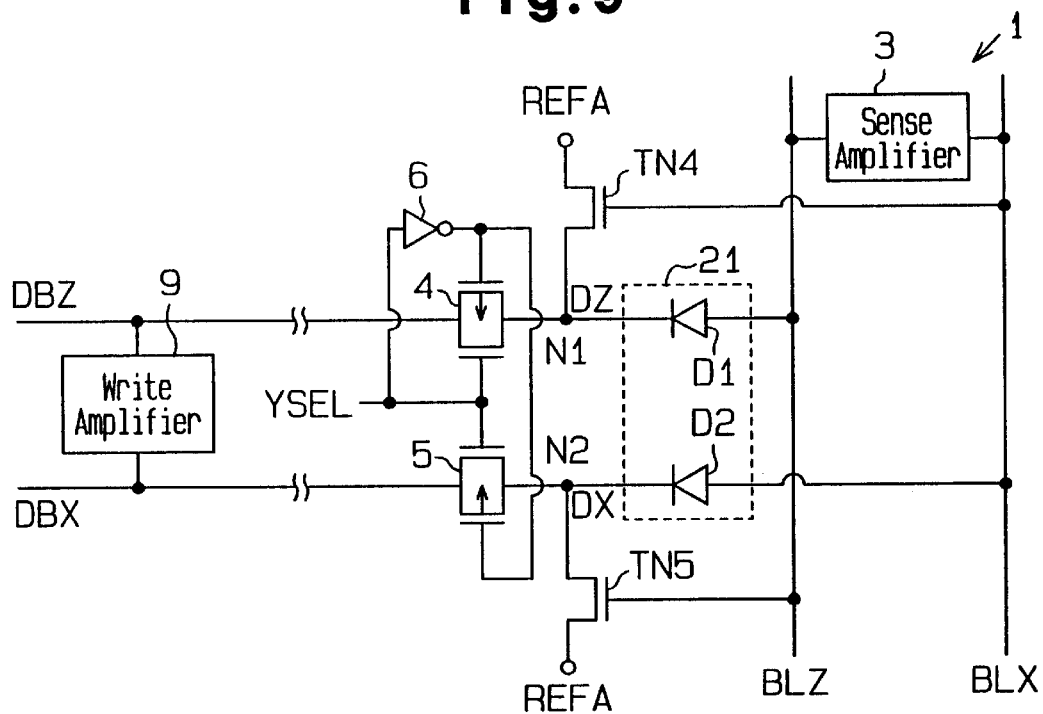
FIG. 9 is a schematic circuit diagram showing a potential difference switch circuit of the DRAM of FIG. 6.

With reference to FIG. 9, the potential difference switch 21 includes diodes D1, D2, serving as rectifying elements and directed toward the data lines DZ, DX from the bit lines BLZ, BLX. In other words, the anode of the diode D1 is connected to the bit line BLZ and the cathode of the diode D1 is connected to a node N1 between the read transistor TN4 and the data line DZ. The anode of the diode D2 is connected to the bit line BLX and the cathode of the diode D2 is connected to a node N2 between the read transistor TN5 and the data line DX.

The operation of the DRAM 1 will now be described with reference to FIG. 11.

A data read operation performed by the DRAM 1 when the data stored in memory cell C is "1" will be described.

In the standby mode, when the equalizer 2 receives a high control signal EQS, the bit line pair BLZ, BLX is precharged to the reference potential REFB (½ of the Vdd level). When the equalizer 8 receives a high control signal EQD, the data bus line pair DBZ, DBX is precharged to the reference potential REFD (Vdd).

The precharge potential having ½ the Vdd level activates the read transistors TN4, TN5 and sets the nodes N1, N2 to 0V (reference potential REFA=Vss). Further, current flows through the diodes D1, D2.

When the selected word line WL is activated and the control signals EQS, EQD simultaneously go low, a slight charge is transferred from the memory cell C connected to the word line WL to the bit line pair BLZ, BLX. When the control signal EQS goes low, the power supply PSG, NSG levels are shifted to the high potential and low potential power supply Vdd, Vss levels, respectively, activating the sense amplifier 3. This differentially amplifies the slight differential potential of the bit line pair BLZ, BLX to the high potential and low potential power supply Vdd, Vss levels.

The low potential power supply Vss level of the bit line BLX deactivates the read transistor TN4, and the high potential power supply Vdd level of the bit line BLZ activates the read transistor TN5. Then, when the column selection signal YSEL goes high and the column switches 4, 5 are activated, the potential at node N1 is set at the precharge potential of the data bus line DBZ, or goes high, since the transistor TN4 is deactivated. The activated transistor TN5 causes the data bus line DBX to go low. That is, the potential at the nodes N1, N2 and the data bus lines DBZ, DBX changes in accordance with the state of the transistors TN4, TN5. In this manner, the data of the bit line pair BLZ, BLX is transferred to the data bus line pair DBZ, DBX via the nodes N1, N2. In other words, the data bus line DBZ is maintained at the high potential power supply Vdd level and the data bus line DBX is maintained at the low potential power supply Vss level. The data of the data bus line pair DBZ, DBX are output from the read amplifier 7 as output signals I/OZ, I/OX.

When performing the read operation, the bit line BLZ and the data bus line DBZ are set at the same Vdd level, and the bit line BLX and the data bus line DBX are set at the same Vss level. Thus, current does not flow from the bit lines BLZ, BLX to the data bus lines DBZ, DBX via the diodes D1, D2, respectively.

Even when the column selection signal YSEL activates the columns switches 4, 5 and the data bus line DBX shifts from a high potential power supply Vdd level to a low potential power supply Vss level, the direction of the voltage applied to the diode D2 is reversed. Thus, current does not flow from the bit line BLX to the data bus line DBX.

If the column switches 4, 5 are activated before the slight differential potential at the bit line pair BLZ, BLX is amplified to the high potential power supply Vdd level and the low potential power supply Vss level, the high level of the data bus lines DBZ, DBX causes a bias acting in a reverse direction to be applied to the diodes D1, D2. Thus, current does not flow from the bit lines BLZ, BLX to the data bus lines DBZ, DBX. Accordingly, a large load is not applied to the sense amplifier 3 during the read operation, amplification by the sense amplifier 3 is ensured, and erroneous functioning is prevented.

A write operation for writing the data of "0" after reading the data of "1" will now be described.

When the input signals I/OZ, I/OX of data "0" is received by the data input buffer 14, the data input buffer 14 sends a low signal DIBZ and a high signal DIBX to the write amplifier 9. In response to a high control signal WE, the write amplifier 9 sets the data bus line DBZ to a low level and the data bus line DBX to a high level. Then, when the column selection signal YSEL goes high, the column switches 4, 5 are activated causing the data to be transferred from the data bus line pair DBZ, DBX to the nodes N1, N2. That is, the node N1 is set at the low potential power supply Vss level and the node N2 is set at the high potential power supply Vdd level.

Since the node N1 is at the low potential power supply Vss level and the bit line BLZ is at the high potential power supply Vdd level, current flows through the diode D1. In this state, the drive capability of the write amplifier 9 is greater than the sense amplifier 3. Thus, the potential at the bit line BLZ is lowered to the low potential power supply Vss level.

The high potential power supply Vdd at the data bus line DBX permits current to flow through the column switch 5 and set the node N2 at the high potential power supply Vdd level. In this state, the direction of the voltage applied to the diode D2 is reversed thereby inhibiting the flow of current through the diode D2. However, since the bit line BLZ is clamped at the low potential power supply Vss level, the sense amplifier 3 causes the bit line BLX potential to increase to the high potential power supply Vdd level inverting the sense amplifier output. In this manner, data is transferred to the bit line pair BLZ, BLX from the data bus line pair DBZ, DBX and written to the memory cell C.

In another example, when the data input is the same as the data read in the previous cycle, the potential levels at the nodes N1, N2 are equal to the potential levels at the bit line pair BLZ, BLX and the write operation is performed without current flowing through the diodes D1, D2.

The value of the reference potential REFA may be changed as required. For example, the reference potential REFA may be set at a first potential in the read operation mode and a second potential, which is greater than the first potential, in the standby mode. Such setting reduces leak current in the standby mode.

Figure 11:
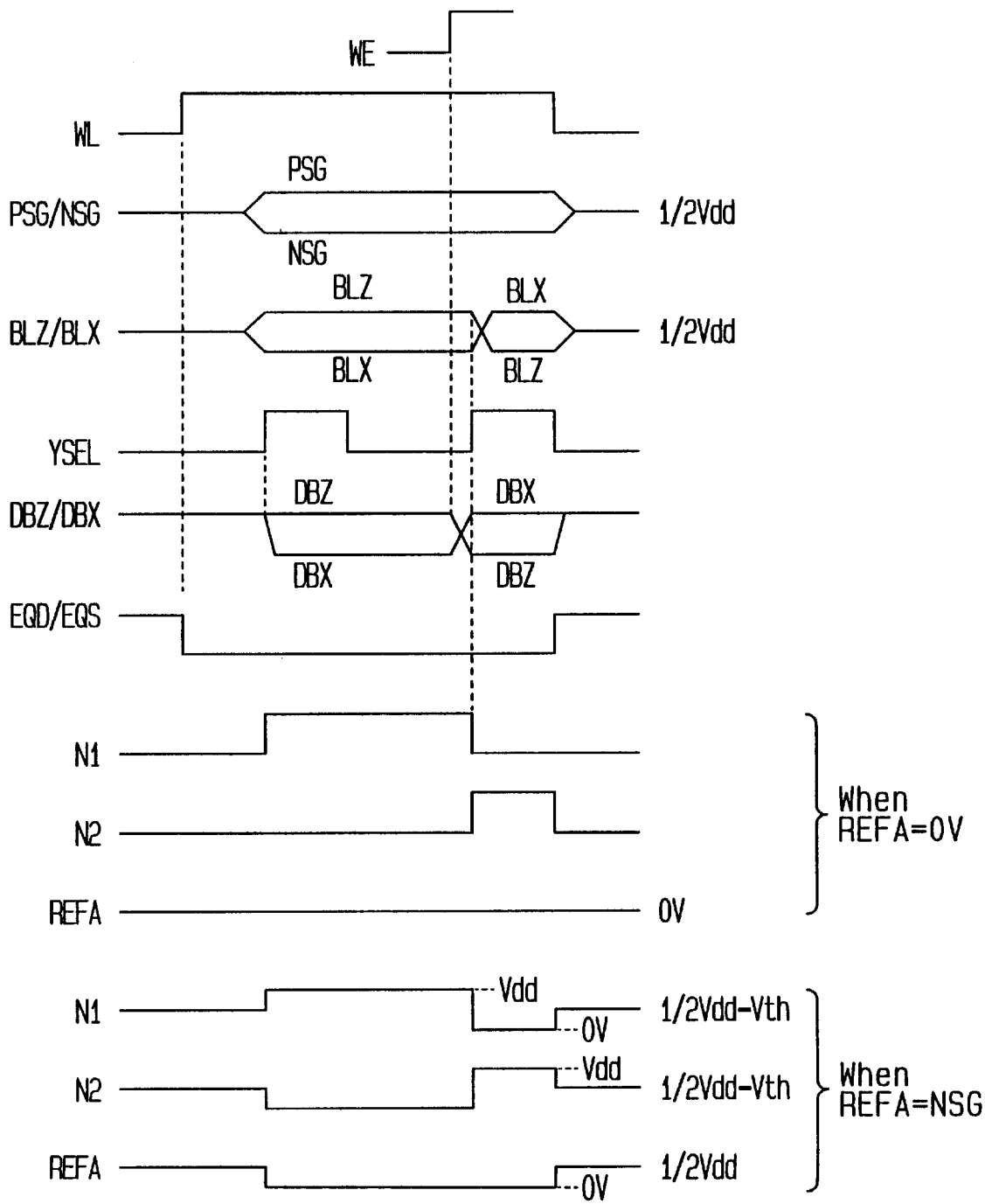
FIG. 11 is a timing chart showing the operation of the DRAM of FIG. 6.

Referring to FIG. 11, if the reference potential REFA is set at the low potential power supply NSG level, in the standby mode, the reference potential REFA is clamped at ½ the Vdd level, and the nodes N1, N2 are clamped at a voltage decreased by a value corresponding to a threshold voltage of the transistors TN4, TN5 from ½ the Vdd level (½Vdd−Vth). In other words, the reference potential REFA is shifted from the low potential power supply Vss level toward the high potential power supply Vdd (½ Vdd) in the standby mode. In this case, current does not flow through the diodes D1, D2 and the transistors TN4, TN5. That is, the current leak passing through the read transistors TN4, TN5 decreases.

Figure 10:
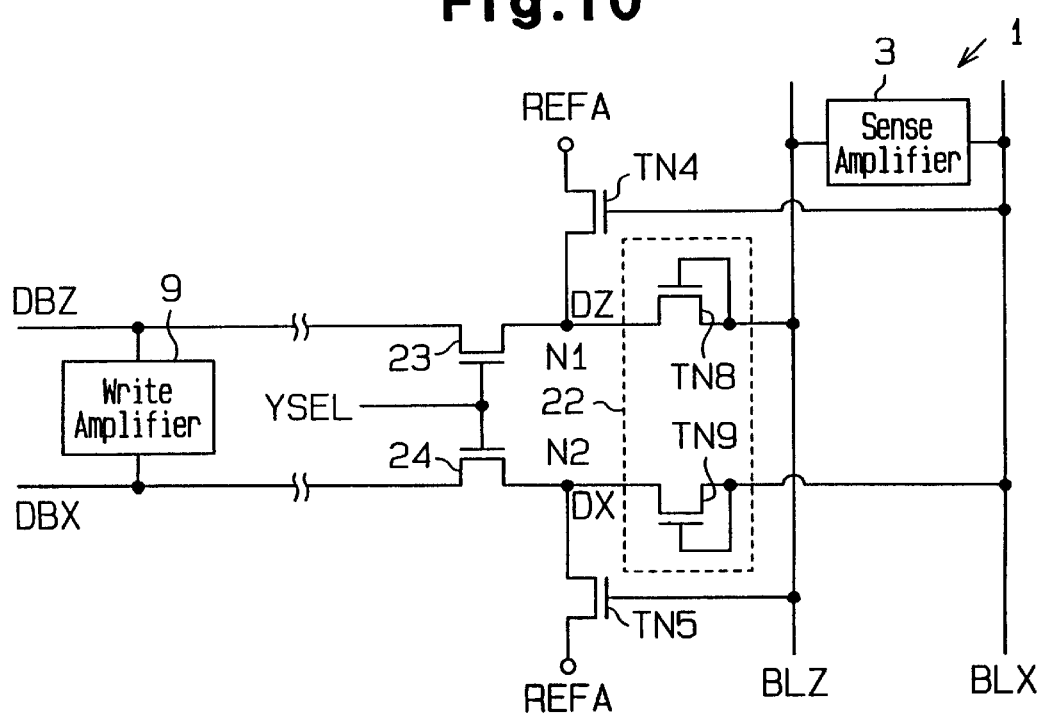
FIG. 10 is a schematic circuit diagram showing a further example of the potential difference switch circuit of FIG. 9.

The diodes D1, D2 may be replaced by diode-connected NMOS transistors TN8, TN9, as shown in FIG. 10. Further, the column switches 4, 5 may be replaced by column switches 23, 24 made with NMOS transistors.

As described above, the first embodiment has the advantages described below.

(1) The read transistors TN5, TN4 operated by the potential at the bit line pair BLZ, BLX transfers the potential of the bit line pair BLZ, BLX to the data line pair DZ, DX. This increases the data read speed.

The DRAM 1 includes the potential difference switch circuit 21 having the diodes D1, D2 directed toward the data lines DZ, DX from the bit lines BLZ, BLX. The potential difference switch circuit 21 enables the read/write data line pair DZ, DX to also function as the column selection line. This significantly decreases the chip area and saves cost. Further, the column decoder used in the first embodiment does not require the control signal WE. Thus, the number of control signal lines is decreased, the parasitic line capacitance Q1 and the logic gate capacitance Qg is eliminated from the total line capacitance, power consumption is decreased, and the speed of the read and write operations are increased.

(2) The read transistors TN4, TN5 are connected to the low potential power supply NSG. This reduces the leak current that flows through the transistors TN4, TN5 during the standby mode and decreases power consumption.

Figure 12:
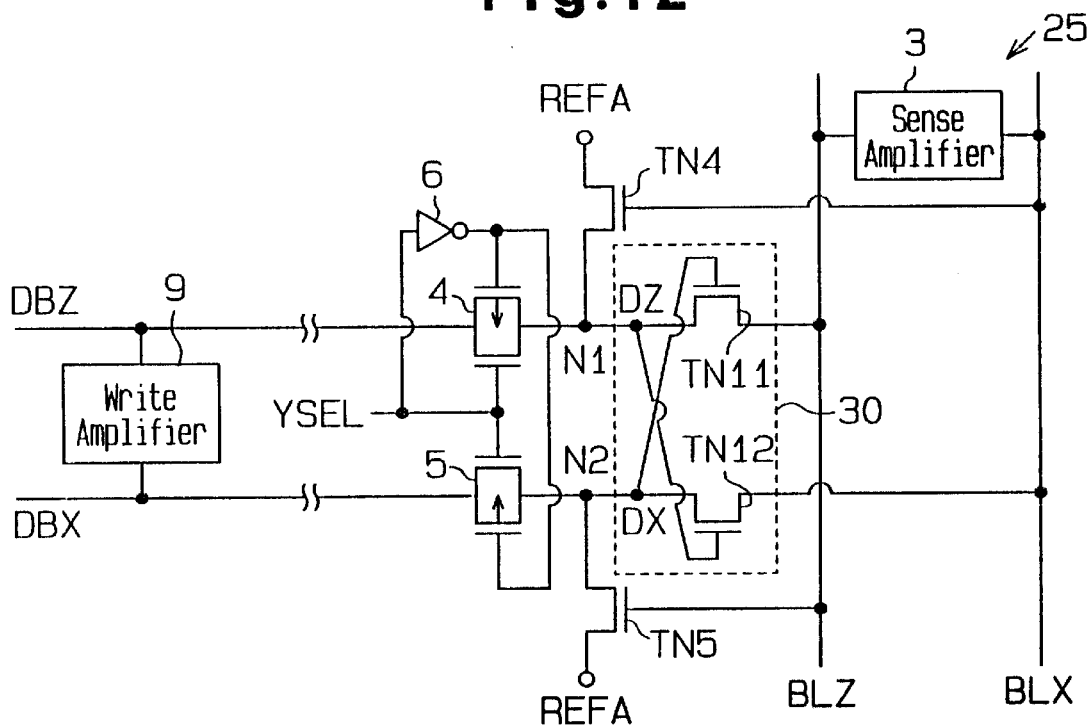
FIG. 12 is a schematic circuit diagram showing a DRAM according to a second embodiment of the present invention.

FIG. 12 is a circuit diagram showing a second embodiment of a DRAM 25 according to the present invention. The DRAM 25 includes a potential difference switch circuit 30 having NMOS transistors TN11, TN12. The NMOS transistor TN11 is connected between the bit line BLZ and the data line DZ. The NMOS transistor TN12 is connected between the bit line BLX and the data line DX. The gate of the NMOS transistor TN11 is connected to the data line DX, and the gate of the NMOS transistor TN12 is connected to the data line DZ.

In the standby mode, if the bit line pair BLZ, BLX is precharged to ½ of the Vdd level, the read transistors TN4, TN5 are activated and the nodes N1, N2 are set to the low potential power supply Vss level (reference potential REFA=Vss). Hence, the transistors TN11, TN12 are both deactivated and the bit line pair BLZ, BLX is not connected to the nodes N1, N2.

When a word line WL is selected and the sense amplifier 3 is activated, the slight differential potential transferred to the bit line pair BLZ, BLX is amplified to the high potential power supply Vdd level and the low potential power supply Vss level. More specifically, when data "1" is read from the memory cell C, the potential at the bit line BLZ is set to the high potential power supply Vdd level, and the potential at the bit line BLX is set at the low potential power supply Vss level. This deactivates the read transistor TN4 and activates the read transistor TN5.

Then, when the column selection signal YSEL goes high, the column switches 4, 5 are activated, and the data of the bit line pair BLZ, BLX is transferred to the data bus line pair DBZ, DBX via the nodes N1, N2. In other words, the data bus line DBZ is held at the high potential power supply Vdd level, and the data bus line DBX is set at the low potential power supply Vss level. Output signals I/OZ, I/OX corresponding to the data transferred to the data bus line pair DBZ, DBX are thus generated from the output circuit.

In the read operation mode, the bit line BLZ and the data bus line DBZ are set at the same potential level (Vdd level), and the bit line BLX and the data bus line DBX are set at the same potential level (Vss level). Thus, current does not flow between the bit line pair BLZ, BLX and the data bus line pair DBZ, DBX via the transistors TN11, TN12, and a large load is not applied to the sense amplifier 3. Accordingly, the amplification of the slight differential potential of the bit line pair BLZ, BLX by the sense amplifier 3 is guaranteed, and abnormal functioning of the sense amplifier is prevented.

When the reference potential REFA is set at the potential of the power supply NSG, in the standby mode, the reference potential REFA is clamped at ½ of the Vdd level, and the nodes N1, N2 are clamped at a voltage lower than the ½ Vdd level by the threshold voltage of the transistors TN4, TN5 (½Vdd−Vth).

The operation for writing data "0" subsequent to reading data "1" will now be described. When data "0" is sent to the write amplifier 9, the write amplifier 9 provides a low potential to the data bus DBZ and a high potential to the data bus line DBX. When a high column selection signal YSEL activates the column switches 4, 5, the data of the bit line pair BLZ, BLX is transferred to the nodes N1, N2. The node N1 is shifted to the low potential power supply Vss level, and the node N2 is shifted to the high potential power supply Vdd level. This activates the transistor TN11, connects the data line DZ and the bit line BLZ via the transistor TN11, and lowers the potential at the bit line BLZ to the low potential power supply Vss.

Since the transistor TN12 is maintained in a deactivated state, the data line DX and the bit line BLX are not connected to each other. However, since the potential at the bit line BLZ is lowered to the low potential power supply Vss level, the sense amplifier 3 inverts the potential at the bit line BLX to the high potential power supply Vdd level. This writes the input data transferred to the bit line pair BLZ, BLX to the memory cell C.

If the read data and the write data are the same (e.g., if the read and write data are both "0"), the node N1 is set at the low potential power supply Vss level, and the node N2 is set at the high potential power supply Vdd level. The transistor TN11, the gate of which is connected to the node N2, is activated and the bit line BLZ and the data line DZ are connected to each other. However, since the data line DZ and the bit line BLZ are set at the low potential power supply Vss level, the bit line BLZ is maintained at the low potential power supply Vss level. The transistor TN12, the gate of which is connected to the node N1, is deactivated and the bit line BLX and the data line DX are disconnected from each other. However, the read data maintains the bit line BLX at the high potential power supply Vdd level. Accordingly, the read data retained at the bit line pair BLZ, BLX is written to the memory cell C.

The DRAM 25 of the second embodiment has the advantages described below.

(1) The second embodiment employs the potential difference switch circuit 30, which includes the NMOS transistors TN11, TN12 connected to the bit line pair BLZ, BLX and the data line pair DZ, DX. The gates of the NMOS transistors TN11, TN12 are connected to the opposing data lines DX, DZ. Thus, the same line functions as the data line and the column selection line. This significantly decreases the chip area and saves cost. The deletion of the column selection lines eliminate the parasitic line capacitance Q1 and the logic gate capacitance Qg from the total line capacitance, decreases power consumption, and increases the speed of the read and write operations.

(2) In the standby mode, the transistors TN11, TN12 of the potential difference switch circuit 30 are deactivated. This decreases the leak current passing through the read transistors TN4, TN5.

Figure 13:
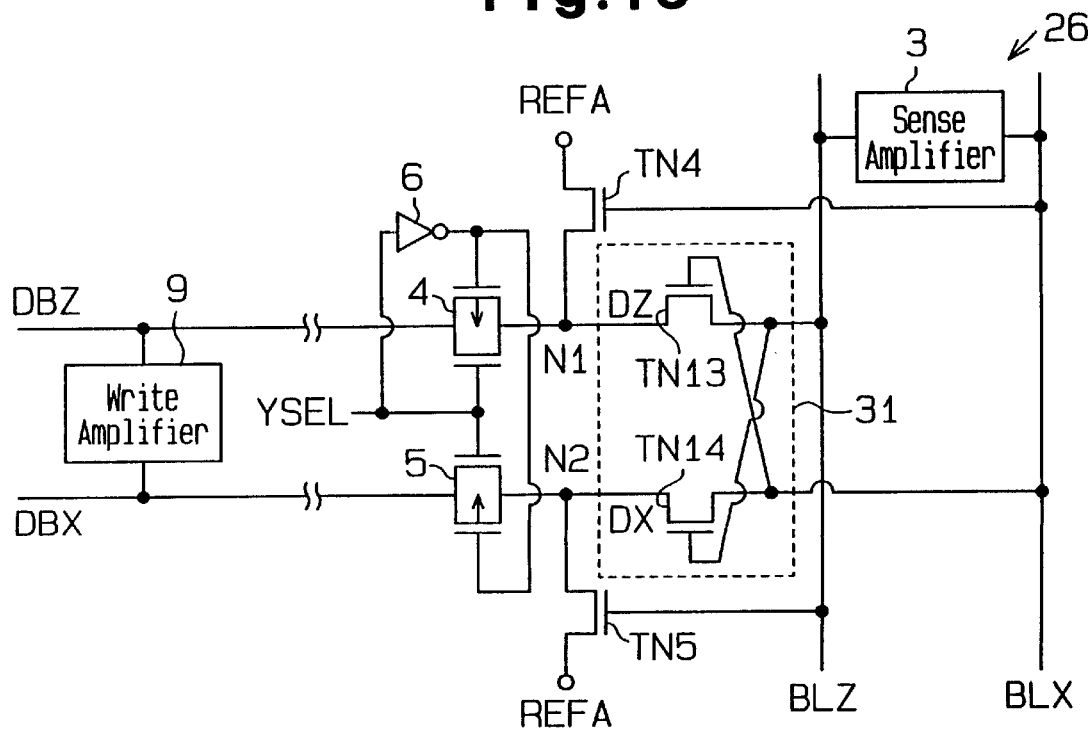
FIG. 13 is a schematic circuit diagram showing a DRAM according to a third embodiment of the present invention.

FIG. 13 is a circuit diagram showing a DRAM 26 according to a third embodiment of the present invention. The DRAM 26 includes a potential difference switch circuit 31 having NMOS transistors TN13, TN14. The NMOS transistors TN13, TN14 are connected between the bit line pair BLZ, BLX (sense amplifier side) and the data line pairs DZ, DX. The gate of the NMOS transistor TN13 is connected to the bit line BLX, and the gate of the NMOS transistor TN14 is connected to the bit line BLZ.

In the standby mode, when the bit line pair BLZ, BLX is precharged to ½ the Vdd level, the read transistors TN4, TN5 are activated and the nodes N1, N2 are set at the low potential level (reference potential REFA=Vss). Further, the activated transistors TN13, TN14 connect the nodes N1, N2 to the bit line pair BLZ, BLX.

Then, a word line WL is selected and the sense amplifier 3 is activated. This amplifies the slight differential potential, transferred to the bit line pair BLZ, BLX, to the high potential power supply Vdd and the low potential power supply Vss. More specifically, the bit line BLZ is set at the high potential power supply Vdd level, and the bit line BLX is set at the low potential power supply Vss level. This activates the read transistor TN5 and deactivates the read transistor TN4.

Subsequently, when a high column selection signal YSEL activates the column switches 4, 5, the data of the bit line pair BLZ, BLX is transferred to the data bus line pair DBZ, DBX via the nodes N1, N2. In other words, the data bus line DBZ is held at the high potential power supply Vdd level, and the data bus line DBX is held at the low potential power supply Vss level. This outputs the data of the data bus line pair DBZ, DBX from the output circuit.

In the read operation mode, the bit line BLZ and the data bus line DBZ have the same potential level (Vdd level), and the bit line BLX and the data bus line DBX have the same potential level (Vss level). Thus, current does not flow between the bit line pair BLZ, BLX and the data bus line DBZ, DBX, and a large load is not applied to the sense amplifier 3. Accordingly, the sense amplifier 3 guarantees the amplification of the slight differential potential at the bit line pair BLX, BLZ and prevents abnormal functioning of the sense amplifier 3.

If the reference potential REFA is set at the potential level of the power supply NSG, in the standby mode, the reference potential REFA is clamped at ½ of the Vdd level, and the nodes N1, N2 are clamped at a voltage lower than the ½ Vdd level by the threshold voltage of the transistors TN4, TN5 (½Vdd−Vth). In this case, the leakage current passing through the transistors TN4, TN5 decreases.

The shifting from the read operation to the write operation (i.e., writing data "0" when the read data is "1") will now be described.

The write amplifier 9 receives data "0", sets the data bus line DBZ to the low potential level, and sends the data bus line DBX to the high potential. Then, when the column selection signal YSEL goes high, the data of the data bus line pair DBZ, DBX is transferred to the nodes N1, N2 via the column switches 4, 5. That is, the node N1 is set at the low potential power supply Vss level, and the node N2 is set at the high potential power supply Vdd level. The high potential power supply Vdd level of the bit line BLZ activates the transistor TN14, connects the data line DX and the bit line BLX via the transistor TN14, and raises the potential at the bit line BLX to the high potential power supply Vdd level.

The transistor TN13 is activated by the high potential power supply Vdd level of the bit line BLX to connect the data line DZ to the bit line BLZ. As a result, the potential at the bit line BLZ is lowered to the low potential power supply Vss level. This writes the input data, transferred to the bit line pair BLZ, BLX, to the memory cell C.

If the read data and the write data are the same (e.g., if the read and write data are both "0"), the node N1 is set at the low potential power supply Vss level, and the node N2 is set at the high potential power supply Vdd level. The transistor TN13 is activated by the high potential power supply Vdd level of the bit line BLX. However, since the data line DZ and the bit line BLZ are set at the low potential power supply Vss level, the bit line BLZ is maintained at the low potential power supply Vss level. The transistor TN14 is deactivated by the low potential power supply Vss level of the bit line BLZ, and the data line DX and the bit line BLX are disconnected from each other. However, the read data maintains the bit line BLX at the high potential power supply Vdd level. Accordingly, the read data retained at the bit line pair BLZ, BLX is written to the memory cell C.

The DRAM 26 of the third embodiment employs the potential difference switch circuit 31, which includes the NMOS transistors TN13, TN14 connected to the bit line pair BLZ, BLX and the data line pair DZ, DX. The gates of the NMOS transistors TN13, TN14 are connected to the opposing bit lines BLX, BLZ. Thus, the same line functions as the data bus line and the column selection line. This significantly decreases the chip area and saves cost. The deletion of the column selection lines eliminate the parasitic line capacitance Q1 and the logic gate capacitance Qg from the total line capacitance, decreases power consumption, and increases the speed of the read and write operations.

It should be apparent to those skilled in the art that the present invention may be embodied in many other specific forms without departing from the spirit or scope of the invention. Particularly, it should be understood that the present invention may be embodied in the following forms.

(a) The precharge level (reference potential REFB) of the bit line pair BLZ, BLX need not be set at ½ of the Vdd level but may be set at the high potential power supply level Vdd or the low potential power supply Vss level. The precharge level (reference potential REFD) of the data bus line pair DBZ, DBX need not be set at the high potential power supply Vdd level but may be set at ½ of the Vdd level or the low potential power supply Vss level.

(b) The write transistors TN4, TN5 and the NMOS transistors TN11, TN12, TN13, TN14 of the associated potential difference switch circuits 30, 31 may be replaced by PMOS transistors.

(c) The present invention may be applied to a system LSI incorporating a DRAM.

(d) The column switches 4, 5 may be deleted and a plurality of the data bus line pairs DBZ, DBX may be connected to a system circuit of a system LSI. In the system LSI, the circuit connection is automatically switched by the potential difference switch circuits 21, 22, 30, 31. Hence, control lines and column switches for shifting between the read operation and the write operation are not required. Accordingly, the chip area is decreased.

(e) The present invention may be applied to a DRAM employing the non-precharged bit-line sensing (NPBS) technique (1998 Symposium on VLSI Circuits Digest of Technical Papers p. 16–17: Jun. 11–13, 1998). In the NPBS technique, one memory cell bit line is connected to a first sense amplifier bit line, and a second sense amplifier bit line is not connected to the memory cell bit line. The sense amplifier inverts the potential at the first sense amplifier bit line and applies the inverted potential to the second sense amplifier bit line.

The present examples and embodiments are to be considered as illustrative and not restrictive, and the invention is not to be limited to the details given herein, but may be modified within the scope and equivalence of the appended claims.

What is claimed is:

1. A semiconductor memory device comprising:

a bit line pair having a first bit line and a second bit line;

a sense amplifier connected between the first and second bit lines;

a data line pair having a first data line and a second data line;

a first transistor connected to a predetermined potential and the first data line of the data line pair, wherein the gate of the first transistor is connected to the first bit line of the bit line pair;

a second transistor connected to the predetermined potential and the second data line of the data line pair, wherein the gate of the second transistor is connected to the second bit line of the bit line pair; and a potential difference switch circuit connected between the data line pair and the bit line pair to transfer data from the data line pair to the bit line pair in accordance with a potential difference between the data line pair and the bit line pair.

2. The semiconductor memory device according to claim 1, wherein the potential difference switch circuit connects the first data line to the second bit line and the second data line to the first bit line in accordance with the potential difference.

3. The semiconductor memory device according to claim 2 further comprising:

a data bus line pair; and column switches connecting the data bus line pair with the data line pair.

4. The semiconductor memory device according to claim 2, wherein the potential difference switch circuit includes a first rectifying element connected between the first data line and the second bit line and a second rectifying element connected between the second data line and the first bit line.

5. The semiconductor memory device according to claim 2, wherein the potential difference switch circuit includes a first MOS transistor connected between the first data line and the second bit line and a second MOS transistor connected between the second data line and the first bit line, wherein the gate of the first MOS transistor is connected to the second bit line, and the gate of the second MOS transistor is connected to the first bit line.

6. The semiconductor memory device according to claim 2, wherein the potential difference switch circuit includes a first MOS transistor connected between the first data line and the second bit line and a second MOS transistor connected between the second data line and the first bit line, wherein the gate of the first MOS transistor is connected to the second data line, and the gate of the second MOS transistor is connected to the first data line.

7. The semiconductor memory device according to claim 2, wherein the potential difference switch circuit includes a first MOS transistor connected between the first data line and the second bit line and a second MOS transistor connected between the second data line and the first bit line, wherein the gate of the first MOS transistor is connected to the first bit line, and the gate of the second MOS transistor is connected to the second bit line.

8. The semiconductor memory device according to claim 1, wherein the predetermined potential includes a low potential power supply.

9. The semiconductor memory device according to claim 1, wherein the predetermined potential includes a first potential, which is set during a read mode, and a second potential, which is higher than the first potential and set during a standby mode.

10. The semiconductor memory device according to claim 9, wherein the first potential has a low potential power supply level and the second potential is set near a high potential power supply level.

11. The semiconductor memory device according to claim 1, further comprising a plurality of memory cells connected to the bit line pair.

12. The semiconductor memory device according to claim 11, further comprising a switch circuit connected between a first part of the bit line pair connected to the plurality of memory cells and a second part of the bit line pair connected to the sense amplifier.

13. The semiconductor memory device according to claim 1, further comprising a plurality of memory cells connected to the first bit line, wherein the sense amplifier inverts the potential at the first bit line and applies the inverted potential to the second bit line.

14. The semiconductor memory device according to claim 13, further comprising a switch circuit connected between a first part of the first bit line connected to the plurality of memory cells and a second part of the first bit line connected to the sense amplifier.

15. A semiconductor memory device comprising:

a bit line pair having a first bit line and a second bit line;

a sense amplifier connected between the first and second bit lines;

a data line pair having a first data line and a second data line;

a first transistor connected to a predetermined potential and the first data line of the data line pair, wherein the gate of the first transistor is connected to the first bit line of the bit line pair;

a second transistor connected to the predetermined potential and the second data line of the data line pair, wherein the gate of the second transistor is connected to the second bit line of the bit line pair; and a potential difference switch circuit connected between the data line pair and the bit line pair to transfer data from the data line pair to the bit line pair in accordance with a potential difference between the data line pair and the bit line pair, wherein the potential difference switch circuit connects the first data line to the second bit line and the second data line to the first bit line in accordance with the potential difference.

16. A semiconductor memory device comprising:

a bit line pair having a first bit line and a second bit line;

a sense amplifier connected between the first and second bit lines;

a data line pair having a first data line and a second data line;

a first transistor connected to a predetermined potential and the first data line of the data line pair, wherein the gate of the first transistor is connected to the first bit line of the bit line pair, wherein the predetermined potential includes a first potential, which is set during a read mode, and a second potential, which is higher than the first potential and set during a standby mode;

a second transistor connected to the predetermined potential and the second data line of the data line pair, wherein the gate of the second transistor is connected to the second bit line of the bit line pair; and a potential difference switch circuit connected between the data line pair and the bit line pair to transfer data from the data line pair to the bit line pair in accordance with a potential difference between the data line pair and the bit line pair.

* * * * *